US008217434B2

(12) United States Patent
Son et al.

(10) Patent No.: US 8,217,434 B2
(45) Date of Patent: Jul. 10, 2012

(54) SEMICONDUCTOR PACKAGE HAVING THROUGH-ELECTRODES WHICH ARE ELECTRICALLY CONNECTED WITH INTERNAL CIRCUIT PATTERNS FORMED IN A SEMICONDUCTOR CHIP AND METHOD FOR MANUFACTURING THE SAME

(75) Inventors: Ho Young Son, Chungcheongbuk-do (KR); Jun Gi Choi, Gyeonggi-do (KR); Seung Taek Yang, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 240 days.

(21) Appl. No.: 12/493,321

(22) Filed: Jun. 29, 2009

(65) Prior Publication Data
US 2010/0276795 A1 Nov. 4, 2010

(30) Foreign Application Priority Data

Apr. 29, 2009 (KR) .................. 10-2009-0037664

(51) Int. Cl.
*H01L 23/48* (2006.01)
*H01L 29/40* (2006.01)
(52) U.S. Cl. .................. 257/276; 257/502; 257/621
(58) Field of Classification Search .................. 257/276, 257/520, 621
See application file for complete search history.

(56) References Cited

U.S. PATENT DOCUMENTS

| 5,229,647 | A | * | 7/1993 | Gnadinger | 257/785 |
|---|---|---|---|---|---|
| 5,380,681 | A | * | 1/1995 | Hsu | 438/109 |
| 5,825,080 | A | * | 10/1998 | Imaoka et al. | 257/659 |
| 7,446,047 | B2 | * | 11/2008 | Tsai et al. | 438/700 |
| 7,589,008 | B2 | * | 9/2009 | Kirby | 438/612 |
| 2005/0275750 | A1 | * | 12/2005 | Akram et al. | 348/374 |
| 2007/0262424 | A1 | * | 11/2007 | Hiatt | 257/667 |
| 2009/0127668 | A1 | * | 5/2009 | Choi | 257/621 |
| 2009/0283898 | A1 | * | 11/2009 | Janzen et al. | 257/698 |
| 2009/0294899 | A1 | * | 12/2009 | Pagaila et al. | 257/528 |
| 2009/0321947 | A1 | * | 12/2009 | Pratt | 257/777 |

FOREIGN PATENT DOCUMENTS

| JP | 2006-287211 A | 10/2006 |
|---|---|---|
| JP | 2009-088193 A | 4/2009 |
| KR | 10-0537892 B1 | 12/2005 |
| KR | 10-0886720 B1 | 2/2009 |
| KR | 100886720 B1 | 2/2009 |
| KR | 10-0537892 B1 | 4/2009 |

OTHER PUBLICATIONS

Winston S. Shue: "Evolution of Cu Electro-Deposition Technologies for 45 nm and Beyond", 2006 International Interconnect Technology Conference, pp. 175-177, Burlingame, CA.

* cited by examiner

*Primary Examiner* — James Mitchell
(74) *Attorney, Agent, or Firm* — Ladas & Parry LLP

(57) ABSTRACT

A semiconductor package capable of being efficiently stacked and a method of manufacturing the same is presented. The semiconductor package includes a semiconductor chip, an insulation layer, and a through-electrode. The semiconductor chip has a first surface and a second surface, a circuit section in the semiconductor chip, an internal circuit pattern electrically connected to the circuit section, and a through-hole that passes through the internal circuit pattern and through the first and second surfaces. The insulation layer is on a through-hole of the semiconductor chip and has an opening which exposes the internal circuit pattern which was exposed by the through-hole. The through-electrode is in the through-hole and electrically coupled to the internal circuit pattern which is exposed through the opening of the insulation layer.

8 Claims, 8 Drawing Sheets

SEMICONDUCTOR PACKAGE HAVING THROUGH-ELECTRODES WHICH ARE ELECTRICALLY CONNECTED WITH INTERNAL CIRCUIT PATTERNS FORMED IN A SEMICONDUCTOR CHIP AND METHOD FOR MANUFACTURING THE SAME

CROSS-REFERENCE TO RELATED APPLICATIONS

The present application claims priority to Korean patent application number 10-2009-0037664 filed on Apr. 29, 2009, which is incorporated herein by reference in its entirety.

BACKGROUND OF THE INVENTION

The present invention relates to a semiconductor package and a method for manufacturing the same.

These days semiconductor chips and semiconductor packages having the semiconductor chips capable of storing and processing huge amounts of data within extremely short time periods have and are further being developed.

Recently proposed, for use in enhancing data storage capacities and for use in for increasing data processing speeds, are stacked semiconductor packages that have at least two semiconductor chips stacked together.

In order to realize the stacked semiconductor package configurations, techniques for electrically coupling together at least two stacked semiconductor chips are needed. In this regard, a technique for electrically connecting stacked semiconductor chips by forming through-electrodes in respective semiconductor chips has recently been disclosed in the art.

The through-electrodes are electrically coupled using wiring lines which are formed on the surfaces of the semiconductor chips. When using the wiring lines formed on the surfaces of the semiconductor chips to couple together the through-electrodes, problems can arise in that the semiconductor chips volume increases.

Even though through-electrodes can be easily coupled together with the wiring lines by using bonding pads placed on the surfaces of the semiconductor chips, the structure of through-electrodes makes it difficult to be electrically coupled directly with the internal circuit patterns formed in the semiconductor chips.

BRIEF SUMMARY OF THE INVENTION

Embodiments of the present invention are directed to a semiconductor package having through-electrodes which are electrically connected with internal circuit patterns formed in a semiconductor chip while preventing the volume of the semiconductor chip from increasing.

Also, embodiments of the present invention are directed to a method for manufacturing the semiconductor package.

In one embodiment of the present invention, a semiconductor package comprises a semiconductor chip having a first surface and a second surface which faces away from the first surface, a circuit section which is placed in the semiconductor chip, an internal circuit pattern which is electrically connected with the circuit section, and a through-hole which passes through the internal circuit pattern and the first and second surfaces; an insulation layer placed on an inner surface of the semiconductor chip which is formed by defining of the through-hole, and having an opening which exposes the internal circuit pattern exposed due to defining of the through-hole; and a through-electrode placed in the through-hole and electrically connected with the internal circuit pattern which is exposed through the opening.

The semiconductor package further comprises a diffusion barrier interposed between the insulation layer and the through-electrode, electrically connected with the internal circuit pattern, and functioning to prevent ions contained in the through-electrode from diffusing.

The semiconductor package further comprises a seed metal layer interposed between the diffusion barrier and the through-electrode and covering the diffusion barrier.

The semiconductor package further comprises a diffusion barrier placed on the insulation layer and having an opening which exposes the internal circuit pattern; and a seed metal layer covering the diffusion barrier and electrically connected with the internal circuit pattern which is exposed through the opening of the diffusion barrier.

The semiconductor package further comprises a bonding pad placed on the first surface of the semiconductor chip and electrically connected with the circuit section; an additional through-electrode electrically connected with the bonding pad and placed in a through-hole which passes through the first and second surfaces; and an additional insulation layer interposed between the additional through-electrode and an inner surface of the semiconductor chip which is formed by defining of the through-hole.

The internal circuit pattern is applied with any one of a power signal, a ground signal, a data signal, and a chip select signal.

At least two semiconductor chips are stacked, and through-electrodes of the semiconductor chips are electrically connected with each other.

In another embodiment of the present invention, a semiconductor package comprises a semiconductor chip having a first surface and a second surface which faces away from the first surface, a circuit section which is placed in the semiconductor chip, first and second internal circuit patterns which are electrically connected with the circuit section and are formed at different positions with different depths when measured from the first surface, and first and second through-holes which pass through the first and second surfaces and the first and second internal circuit patterns; first and second insulation layers placed on inner surfaces of the semiconductor chip which are formed by defining of the first and second through-holes, and having first and second openings which expose the first and second internal circuit patterns exposed due to defining of the first and second through-holes; and first and second through-electrodes placed in the first and second through-holes and electrically connected with the first and second internal circuit patterns which are exposed through the first and second openings.

The semiconductor package further comprises a first diffusion barrier placed on the first insulation layer and electrically connected with the first internal circuit pattern; a seed metal layer interposed between the first diffusion barrier and the first through-electrode; a second diffusion barrier placed on the second insulation layer and having an opening which exposes the second internal circuit pattern; and a second seed metal layer covering the second diffusion barrier and electrically connected with the second internal circuit pattern.

The first internal circuit pattern and the second internal circuit pattern are formed of different metals.

The semiconductor package further comprises a bonding pad placed on the first surface of the semiconductor chip and electrically connected with the circuit section; an additional through-electrode electrically connected with the bonding pad and placed in an additional through-hole which passes through the first and second surfaces; and an additional insulation layer interposed between the additional through-electrode and an inner surface of the semiconductor chip which is formed by defining of the additional through-hole.

In still another embodiment of the present invention, a method for manufacturing a semiconductor package comprises the steps of manufacturing a semiconductor chip which has a first surface and a second surface facing away from the first surface, a circuit section placed therein, and an internal circuit pattern electrically connected with the circuit section and formed therein; defining a blind via to extend from the first surface through the internal circuit pattern toward the second surface, and thereby exposing the internal circuit pattern; forming an insulation layer on an inner surface of the semiconductor chip which is formed by defining of the blind via, to have an opening which exposes the internal circuit pattern; forming a through-electrode to be placed in the blind via and be electrically connected with the internal circuit pattern which is exposed through the opening; and processing the second surface and thereby exposing the through-electrode.

Between the steps of forming the insulation layer and the through-electrode, the method further comprises the step of forming a diffusion barrier to cover the insulation layer and be electrically connected with the internal circuit pattern.

Between the steps of forming the diffusion barrier and the through-electrode, the method further comprises the step of forming a seed metal layer to cover the diffusion barrier.

In the steps of forming the insulation layer and the diffusion barrier, the insulation layer and the diffusion barrier are formed through an electro-grafting process or a chemical grafting process.

Between the steps of forming the insulation layer and the through-electrode, the method further comprises the steps of forming a diffusion barrier to cover the insulation layer and have an opening which exposes the internal circuit pattern; and forming a seed metal layer to cover the diffusion barrier and be electrically connected with the internal circuit pattern which is exposed through the opening of the diffusion barrier.

In a still further embodiment of the present invention, a method for manufacturing a semiconductor package comprises the steps of manufacturing a semiconductor chip having a first surface and a second surface which faces away from the first surface, a circuit section which is placed in the semiconductor chip, first and second internal circuit patterns which are electrically connected with the circuit section and are formed at different positions with different depths when measured from the first surface, and first and second through-holes which pass through the first and second surfaces and the first and second internal circuit patterns; forming first and second insulation layers to be placed on inner surfaces of the semiconductor chip formed by defining of the first and second through-holes and to have first and second openings which expose the first and second internal circuit patterns exposed due to defining of the first and second through-holes; forming a first diffusion barrier on the first insulation layer to be electrically connected with the first internal circuit pattern through the first opening and a second diffusion barrier on the second insulation layer to have a third opening which is aligned with the second opening; forming a first seed metal layer on the first diffusion barrier and a second seed metal layer on the second diffusion barrier to be electrically connected with the second internal circuit pattern; and forming first and second through-electrodes on the first and second seed metal layers.

At least two semiconductor chips are stacked, and through-electrodes of the semiconductor chips are electrically connected with each other.

The first internal circuit pattern and the second internal circuit pattern are formed of different metals.

In the steps of forming the first and second insulation layers and the first and second diffusion barriers, the first and second insulation layers and the first and second diffusion barriers are formed through an electro-grafting process or a chemical grafting process.

DESCRIPTION OF SPECIFIC EMBODIMENTS

Hereinafter, specific embodiments of the present invention will be described in detail with reference to the accompanying drawings. It is understood herein that the drawings are not necessarily to scale and in some instances proportions may have been exaggerated in order to more clearly depict certain features of the invention.

Figure 1:
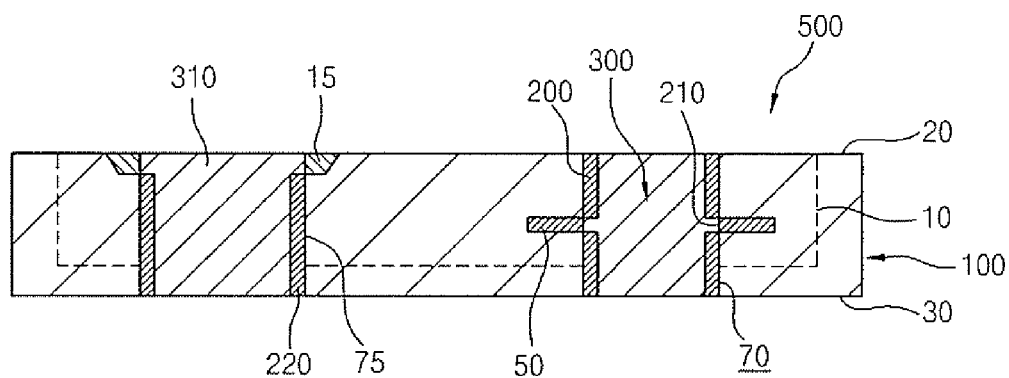
FIG. 1 is a sectional view illustrating a semiconductor package in accordance with a first embodiment of the present invention.

FIG. 1 is a sectional view illustrating a semiconductor package in accordance with a first embodiment of the present invention.

Referring to FIG. 1, a semiconductor package 500 includes a semiconductor chip 100, an insulation layer 200, and a through-electrode 300.

The semiconductor chip 100 has a circuit section 10, a bonding pad 15, an internal circuit pattern 50, and a through-hole 70.

The semiconductor chip 100 has the shape of a rectangular hexahedron which has a first surface 20 and a second surface 30 facing away from the first surface 20.

The circuit section 10 is placed in the semiconductor chip 100. The circuit section 10 includes a data storage unit (not shown) for storing data and a data processing unit (not shown) for processing data.

The bonding pad 15 is placed, for example, on the first surface 20 of the semiconductor chip 100 and is electrically connected with the circuit section 10. An example of the signal applied to the bonding pad 15 can be any one of a power signal, a ground signal, a data signal, and a chip select signal.

The internal circuit pattern 50 is placed in the semiconductor chip 100 and is electrically connected with the circuit section 10. An example of the signal applied to the internal circuit pattern 50 can be any one of a power signal, a ground signal, a data signal, and a chip select signal.

The through-hole 70 passes through the first surface 20 and the second surface 30 of the semiconductor chip 100. In the present embodiment, the through-hole 70 passes through a position corresponding to the internal circuit pattern 50. An inner surface is formed in the semiconductor chip 100 due to defining of the through-hole 70, and the internal circuit pattern 50 is exposed on the inner surface.

The insulation layer 200 is placed on the inner surface which is formed due to defining of the through-hole 70 passing through the internal circuit pattern 50.

In the present embodiment, the insulation layer 200 can comprise an organic layer or an inorganic layer. The insulation layer 200 has an opening 210 which selectively exposes the internal circuit pattern 50. The opening 210 can be formed in an annular shape along the inner surface.

The through-electrode 300 is placed on the insulation layer 200 which passes through the internal circuit pattern 50. In the present embodiment, the through-electrode 300 can be formed of any electrically conductive material such as copper, aluminum, gold, silver, polysilicon, and alloys thereof. In the present embodiment, the through-electrode 300 is electrically coupled to the internal circuit pattern 50 through the opening 210 which is defined in the insulation layer 200. The through-electrode 300 and the circuit section 10 are electrically coupled to the internal circuit pattern 50.

The semiconductor package 500 according to the present embodiment can also include an additional through-hole 75, an additional insulation layer 220 and an additional through-electrode 310.

The additional through-hole 75 passes through the first surface 20 and the second surface 30 of the semiconductor chip 100. The additional through-hole 75 also passes through the bonding pad 15 of the semiconductor chip 100.

The additional insulation layer 220 is placed on the inner surface of the semiconductor chip 100 which is formed by defining of the additional through-hole 75. In the present embodiment, the additional insulation layer 220 has an opening which exposes the bonding pad 15.

The additional through-electrode 310 is placed within the additional through-hole 75. The additional through-electrode 310 is electrically coupled to the bonding pad 15 which is exposed through the additional insulation layer 220.

Figure 2:
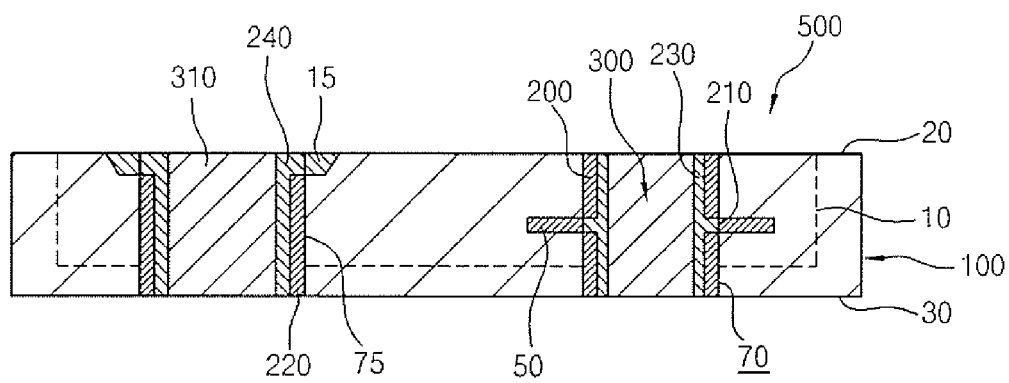
FIG. 2 is a sectional view illustrating a semiconductor package in accordance with a second embodiment of the present invention.

FIG. 2 is a sectional view illustrating a semiconductor package in accordance with a second embodiment of the present invention. The semiconductor package illustrated in FIG. 2 is substantially the same as the semiconductor package described above with reference to FIG. 1 except it shows diffusion barriers 230. Therefore, detailed descriptions for the same component elements will be omitted herein, and the same terms and the same reference numerals will be used to refer to the same component elements.

Referring to FIG. 2, a semiconductor package 500 includes a semiconductor chip 100, an insulation layer 200, a through-electrode 300, and a diffusion barrier 230.

The diffusion barrier 230 prevents or at least protects against unwanted metal ions contained in the through-electrode 300 from diffusing into a circuit section 10 of the semiconductor chip 100 by passing through the insulation layer 200. The diffusion barrier 230 comprises, for example, an ultralight layer made of titanium (Ti) and/or titanium nitride (TiN).

The diffusion barrier 230 preferably covers the insulation layer 200 and is electrically coupled to the internal circuit pattern 50 which is exposed through the opening defined in the insulation layer 200.

The semiconductor package 500 according to the present embodiment can also include an additional through-hole 75, an additional insulation layer 220, an additional through-electrode 310, and an additional diffusion barrier 240.

The additional through-hole 75 passes through the semiconductor chip 100 between the first surface 20 and the second surface 30. The additional through-hole 75 also passes through the bonding pad 15 of the semiconductor chip 100.

The additional insulation layer 220 is placed on the inner surface of the additional through-hole 75 of the semiconductor chip 100. In the present embodiment, the additional insulation layer 220 has an opening that also exposes the bonding pad 15.

The additional diffusion barrier 240 is placed on the additional insulation layer 220 and is electrically connected with the bonding pad 15. The additional diffusion barrier 240 prevents or at least protects against metal ions contained in the additional through-electrode 310 from diffusing into the circuit section 10 of the semiconductor chip 100 by passing through the additional insulation layer 220. The additional diffusion barrier 240 may comprise, for example, an ultralight layer composed of titanium (Ti) or titanium nitride (TiN) and admixtures thereof.

The additional through-electrode 310 is placed within the additional diffusion barrier 240 in which the additional diffusion barrier 240 is placed within the additional insulation layer 220. The additional through-electrode 310 is electrically coupled to the bonding pad 15 by the additional diffusion barrier 240.

Figure 3:
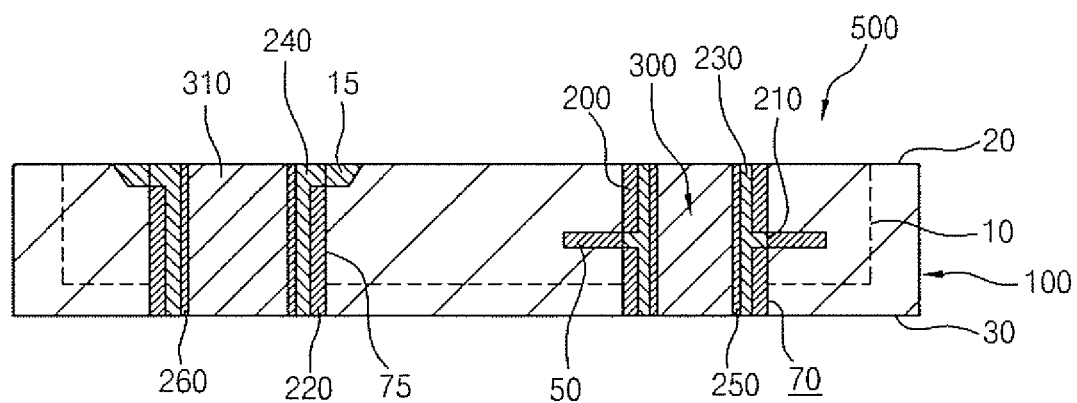
FIG. 3 is a sectional view illustrating a semiconductor package in accordance with a third embodiment of the present invention.

FIG. 3 is a sectional view illustrating a semiconductor package in accordance with a third embodiment of the present invention. The semiconductor package illustrated in FIG. 3 is substantially the same as the semiconductor package described above with reference to FIG. 2 except seed metal layers 250 are included. Therefore, detailed descriptions for the same component elements will be omitted herein, and the same terms and the same reference numerals will be used to refer to the same component elements.

Referring now to FIG. 3, a semiconductor package 500 includes a semiconductor chip 100, an insulation layer 200, a through-electrode 300, a diffusion barrier 230, and a seed metal layer 250.

The seed metal layer 250 is shown placed within the diffusion barrier 230. In the present embodiment, the seed metal layer 250 covers the interior surface of the diffusion barrier 230. The through-electrode 300 is subsequently formed within the seed metal layer 250 by using a plating process that exploits the presence of the seed metal layer 250.

The semiconductor package 500 according to the present embodiment can optionally include an additional through-hole 75, an additional insulation layer 220, an additional through-electrode 310, an additional diffusion barrier 240, and an additional seed metal layer 260.

The additional seed metal layer 260 is placed on the additional diffusion barrier 240.

The additional through-electrode 310 is shown placed within the additional diffusion barrier 240 in which the additional diffusion barrier 240 within the additional insulation layer 220. The additional through-electrode 310 is electrically coupled to the bonding pad 15 via the additional seed metal layer 260.

Figure 4:
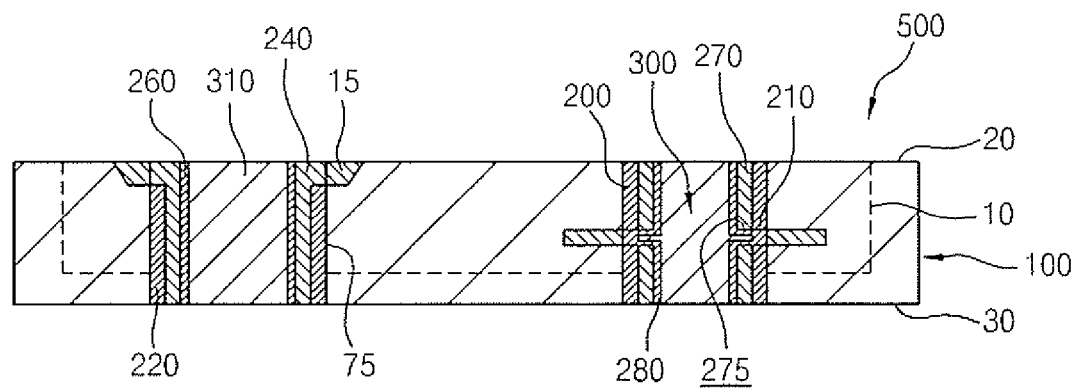
FIG. 4 is a sectional view illustrating a semiconductor package in accordance with a fourth embodiment of the present invention.

FIG. 4 is a sectional view illustrating a semiconductor package in accordance with a fourth embodiment of the present invention. The semiconductor package illustrated in FIG. 4 is substantially the same as the semiconductor package described above with reference to FIG. 3 except a diffusion barrier and a seed metal layer are added. Therefore, detailed descriptions for the same component elements will be omitted herein, and the same terms and the same reference numerals will be used to refer to the same component elements.

Referring now to FIG. 4, a semiconductor package 500 may include a semiconductor chip 100, an insulation layer 200, a through-electrode 300, a diffusion barrier 270, and a seed metal layer 280.

The diffusion barrier 270 is shown placed within the insulation layer 200. The diffusion barrier 270 is shown having an opening 275 that exposes an opening 210 in the insulation layer 200.

The seed metal layer 280 is shown placed within the diffusion barrier 270. In the present embodiment, the seed metal layer 280 covers the inside surfaces of the diffusion barrier 270. Due to this fact, the seed metal layer 280 is electrically coupled to the internal circuit pattern 50 via the opening 275 in the diffusion barrier 270. The through-electrode 300 is shown within seed metal layer 280 and formed by a plating process that uses the seed metal layer 280.

The semiconductor package 500 according to the present embodiment can include an additional through-hole 75, an additional insulation layer 220, an additional through-electrode 310, an additional diffusion barrier 240, and an additional seed metal layer 260.

The additional seed metal layer 260 is shown placed within the additional diffusion barrier 240.

The additional through-electrode 310 is subsequently placed within the additional diffusion barrier 240 in which the additional diffusion barrier 240 is placed within the additional insulation layer 220. The additional through-electrode 310 is electrically coupled to the bonding pad 15 via the additional seed metal layer 260.

Figure 5:
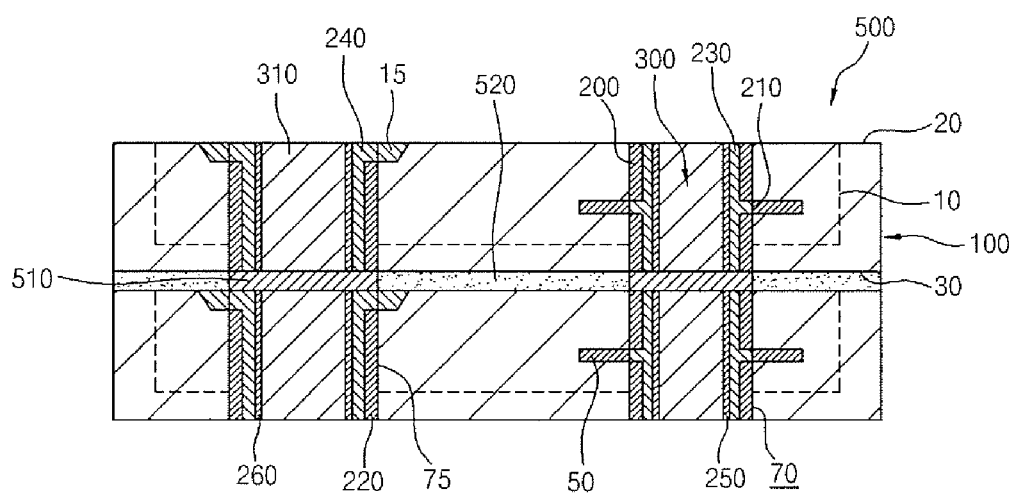
FIG. 5 is a sectional view illustrating a semiconductor package in accordance with a fifth embodiment of the present invention.

FIG. 5 is a sectional view illustrating a semiconductor package in accordance with a fifth embodiment of the present invention. The semiconductor package illustrated in FIG. 5 is substantially the same as the semiconductor package described above with reference to FIG. 3 except the number of semiconductor chips and connection members. Therefore, detailed descriptions for the same component elements will be omitted herein, and the same terms and the same reference numerals will be used to refer to the same component elements.

Referring now to FIG. 5, in the present embodiment, a semiconductor package 500 is shown comprising at least two semiconductor chips 100 stacked together. Through-electrodes 300, are each shown formed within the at least two semiconductor chips 100 and shown aligned with each other at predefined positions so that they are placed to face each other.

Connection members 510 are shown placed between the semiconductor chips 100 of the semiconductor package 500 for electrically coupling together the through-electrodes 300 facing each other. That is, the through-electrodes 300 are electrically coupled together with each other via the connection members 510. A gap-fill member 520 along with the connection members 510 may also be placed in the space defined between the stacked semiconductor chips 100.

Figure 6:
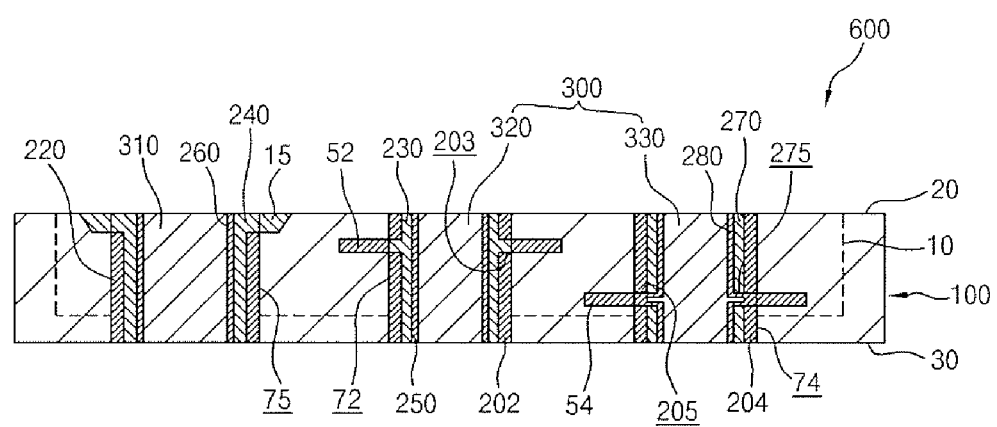
FIG. 6 is a sectional view illustrating a semiconductor package in accordance with a sixth embodiment of the present invention.

FIG. 6 is a sectional view illustrating a semiconductor package in accordance with a sixth embodiment of the present invention.

Referring now to FIG. 6, a semiconductor package 500 includes a semiconductor chip 100 which is defined with first and second through-holes 72 and 74, first and second insulation layers 202 and 204, first and second through-electrodes 320 and 330 collectively designated by the reference numeral 300, first and second diffusion barriers 230 and 270, and first and second seed metal layers 250 and 280.

The semiconductor chip 100 is shown having a first surface 20 and a second surface 30 that faces away from the first surface 20. A circuit section 10, which may have a data storage unit (not shown) and a data processing unit (not shown), is shown placed in the semiconductor chip 100. A bonding pad 15, which is electrically connected with the circuit section 10, is shown positioned on the first surface 20 of the semiconductor chip 100.

Internal circuit patterns 52 and 54 are placed in the semiconductor chip 100. Hereafter, the internal circuit patterns 52 and 54 which are placed in the semiconductor chip 100 will be defined as a first internal circuit pattern 52 and a second internal circuit pattern 54.

The first internal circuit pattern 52 and the second internal circuit pattern 54 are shown placed at different positions along the semiconductor chip 100 when viewed from the top. Also, the first internal circuit pattern 52 and the second internal circuit pattern 54 are shown formed at different depths measured from the first surface 20.

For example, the first internal circuit pattern 52 is placed at a first depth when measured from the first surface 20, and the second internal circuit pattern 54 is formed at a second depth greater than the first depth when measured from the first surface 20.

In the present embodiment, the first and second internal circuit patterns 52 and 54 can, for example, contain different metals. For example, any one of the first and second internal circuit patterns 52 and 54 can contain copper and the other of the first and second internal circuit patterns 52 and 54 can contain aluminum.

The semiconductor chip 100 is shown having the first through-hole 72 and the second through-hole 74. The first through-hole 72 is shown passing through the semiconductor chip 100 and through the first internal circuit pattern 52, and due to this fact, a portion of the first internal circuit pattern 52 is exposed to the outside via the first through-hole 72.

The second through-hole 74 shown passing through the semiconductor chip 100 and passing through the second internal circuit pattern 54, and due to this fact, a portion of the second internal circuit pattern 54 is exposed by the second through-hole 74.

The first insulation layer 202 is shown placed onto the inner surface of the first through-hole 72. Also shown is that the first insulation layer 202 has a first opening 203 that exposes the first internal circuit pattern 52.

The second insulation layer 204 is shown placed onto the inner surface of the second through-hole 74. Also shown is that the second insulation layer 204 has a second opening 205 that exposes the second internal circuit pattern 54.

The first diffusion barrier 230 is shown within the first insulation layer 202. The first diffusion barrier 230 is electrically coupled to the first internal circuit pattern 52 via the first opening 203 defined in the first insulation layer 202.

The second diffusion barrier 270 is shown within the second insulation layer 204. The second diffusion barrier 270 shown to have a third opening 275 which is defined at substantially the same position with substantially the same sectional shape as the second opening 205 of the second insulation layer 204. Due to this the second diffusion barrier 270 and the second internal circuit pattern 54 are electrically insulated away from each other.

The first seed metal layer 250 is shown placed within the first diffusion barrier 230.

The second seed metal layer 280 is shown within the second diffusion barrier 270 and the second internal circuit pattern 54. Due to this fact, the second seed metal layer 280 is electrically coupled to the second internal circuit pattern 54.

The first through-electrode 320 is placed on the first seed metal layer 250 and fills the first through-hole 72. The second through-electrode 330 is placed on the second seed metal layer 280 and fills the second through-hole 74.

Meanwhile, the semiconductor package 500 according to the present embodiment can optionally include an additional through-hole 75, an additional insulation layer 220, an additional through-electrode 310, an additional diffusion barrier 240, and an additional seed metal layer 260.

The additional seed metal layer 260 is shown placed within the additional diffusion barrier 240. The additional through-electrode 310 is shown placed within the additional diffusion barrier 240 in which is placed the additional diffusion barrier 240 is shown within the additional insulation layer 220. The additional through-electrode 310 is electrically coupled to the bonding pad 15 by the additional seed metal layer 260.

FIGS. 7 through 10 are sectional views illustrating a method for manufacturing a semiconductor package in accordance with a seventh embodiment of the present invention.

Figure 7:
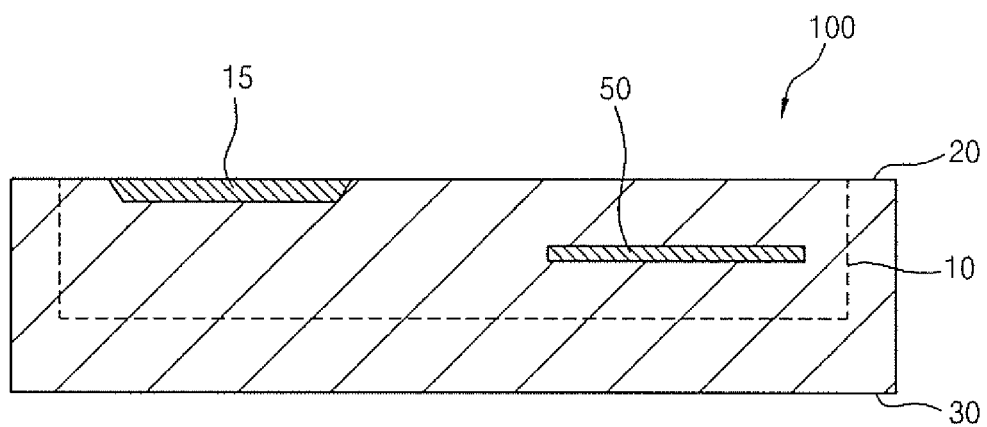
FIGS. 7 through 10 are sectional views illustrating a method for manufacturing a semiconductor package in accordance with a seventh embodiment of the present invention.

Referring to FIG. 7, in order to manufacture a semiconductor package, a semiconductor chip 100 is first manufactured. A circuit section 10, which has a data storage unit (not shown) for storing data and a data processing unit (not shown) for processing data, is formed in the semiconductor chip 100 by using any number of well known semiconductor device manufacturing processes. A bonding pad 15 is formed on a first surface 20 of the semiconductor chip 100 to be electrically connected with the circuit section 10, and an internal circuit pattern 50 is formed in the semiconductor chip 100 to be electrically connected with the circuit section 10.

Figure 8:
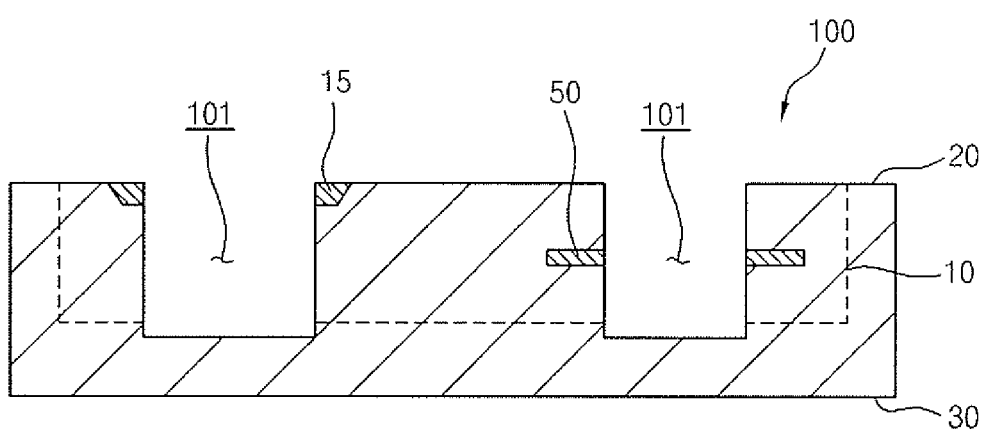

Referring to FIG. 8, after the bonding pad 15 and the internal circuit pattern 50 are formed on and in the semiconductor chip 100, blind vias 101 are defined that extend from the first surface 20 of the semiconductor chip 100 toward a second surface 30 facing away from the first surface 20. The blind vias 101 pass through, for example, the bonding pad 15 and through the internal circuit pattern 50. Due to this fact the bonding pad 15 and the internal circuit pattern 50 are exposed on the inner surfaces by the blind vias 101.

Figure 9:
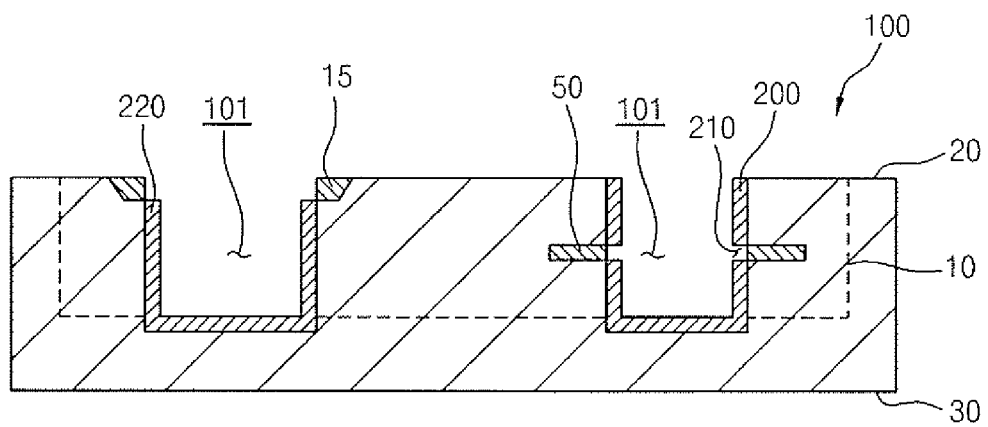

Referring to FIG. 9, after the blind vias 101 are defined in the semiconductor chip 100, insulation layers 200 and 220 are respectively formed on the inner surfaces of the blind vias 101.

The insulation layers 200 and 220 can be formed using an electro-grafting process or using a chemical grafting process. The insulation layers 200 and 220 are not formed on the bonding pad 15 and not formed on the internal circuit pattern 50. The insulation layers 200 and 220 are formed selectively on the inner surfaces of the semiconductor chip 100 along the blind vias 101 by using the electro-grafting process or the chemical grafting process.

As a result ring-shaped openings 210 are defined in the insulation layers 200 and 220 that expose the bonding pad 15 and that expose the internal circuit pattern 50 on the inner surfaces along the blind vias 101 of the semiconductor chip 100.

Figure 10:
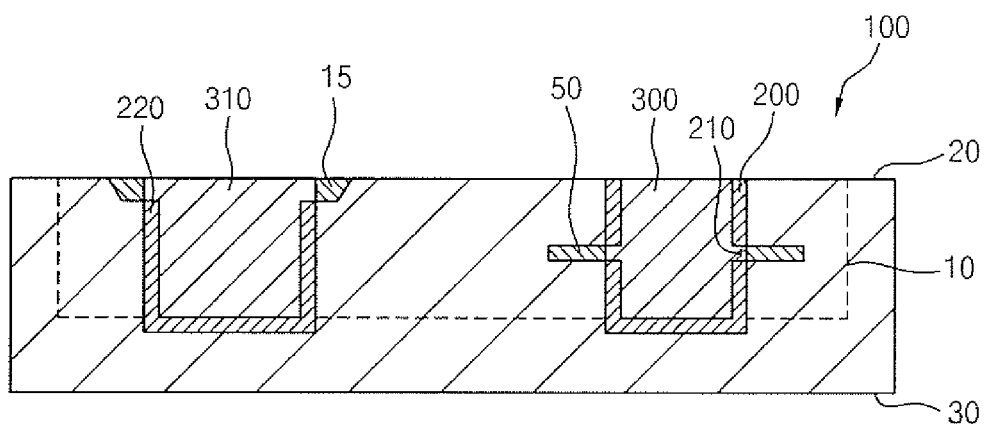

Referring now to FIG. 10, after the insulation layers 200 and 220, which have the openings 210 exposing the bonding pad 15 and the internal circuit pattern 50, are formed through the electro-grafting process or the chemical grafting process, through-electrodes 300 and 310 are formed within the blind vias 101 by preferably using an electroless plating process.

Then, as the second surface 30 of the semiconductor chip 100 facing away from the first surface 20 undergoes processing, the thickness of the semiconductor chip 100 decreases. As the thickness of the semiconductor chip 100 decreases, the through-electrodes 300 and 310 are exposed on the second surface 30 of the semiconductor chip 100, whereby a semiconductor package 500 as shown in FIG. 1 is subsequently manufactured.

In the present embodiment, the second surface 30 of the semiconductor chip 100 can be processed using a CMP (chemical mechanical polishing) process or using an etching process so that the thickness of the semiconductor chip 100 is decreased to expose an end portion, which corresponds to the second surface 30, of the through-electrode.

Figure 11:
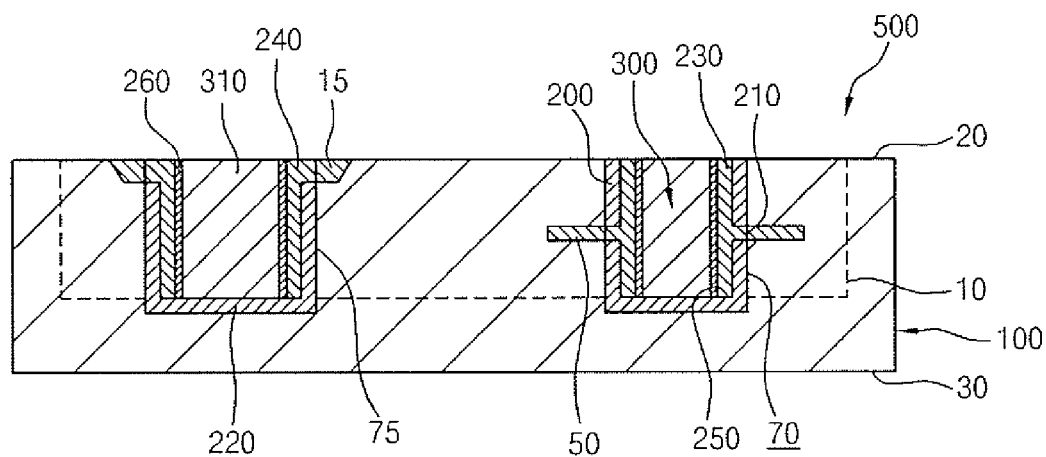
FIG. 11 is a sectional view illustrating a method for manufacturing a semiconductor package in accordance with an eighth embodiment of the present invention.

FIG. 11 is a sectional view illustrating a method for manufacturing a semiconductor package in accordance with an eighth embodiment of the present invention. The method for manufacturing a semiconductor package illustrated in FIG. 11 has substantially the same construction as the method for manufacturing a semiconductor package described above with reference to FIGS. 7 through 10 for except the processes for forming diffusion barriers and seed metal layers. Therefore, detailed descriptions for the same component elements will be omitted herein, and the same terms and the same reference numerals will be used to refer to the same component elements.

Referring to FIG. 11, after insulation layers 200 and 220, which have openings 210 exposing an internal circuit pattern 50 and a bonding pad 15, are formed on the inner surfaces which are formed by defining blind vias in a semiconductor chip 100, diffusion barriers 230 and 240 are shown formed on the insulation layers 200 and 220.

Similar to the insulation layers 200 and 220, the diffusion barriers 230 and 240 can be formed by using an electro-grafting process or a chemical grafting process. The diffusion barriers 230 and 240 are formed on the insulation layers 200 and 220 and formed on the internal circuit pattern 50 and on the bonding pad 15 exposed through the insulation layers 200 and 220. Accordingly the internal circuit pattern 50 and the bonding pad 15 become electrically coupled to the diffusion barriers 230 and 240.

Next, seed metal layers 250 and 260 are formed within the diffusion barriers 230 and 240 in which the diffusion barriers 230 and 240 are electrically connected with the internal circuit pattern 50 and the bonding pad 15. The seed metal layers 250 and 260 can be formed through any one of a physical and chemical vapor deposition process, an atomic layer deposition process and a chemical vapor deposition process.

After the seed metal layers 250 and 260 are formed, through-electrodes 300 and 310 are formed on the seed metal layers 250 and 260 which results in the manufactured semiconductor package 500.

Figure 12:
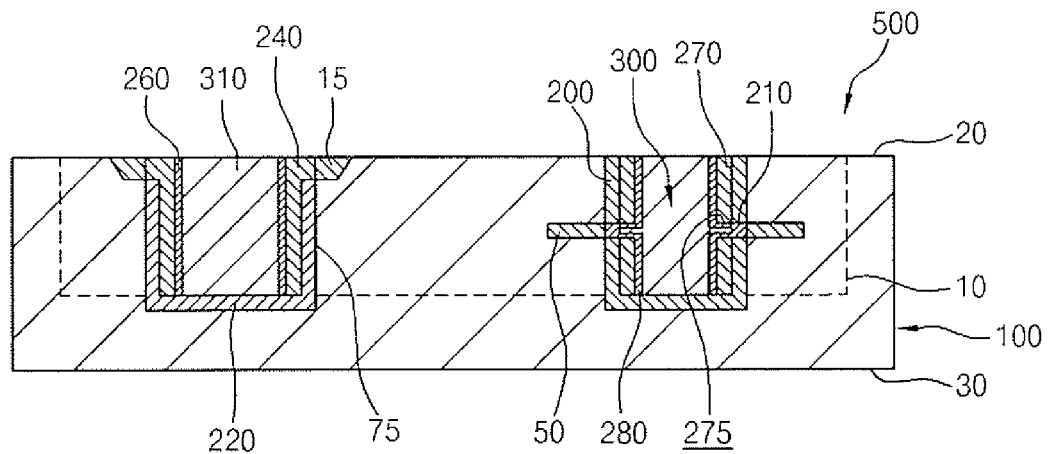
FIG. 12 is a sectional view illustrating a method for manufacturing a semiconductor package in accordance with a ninth embodiment of the present invention.

FIG. 12 is a sectional view illustrating a method for manufacturing a semiconductor package in accordance with a ninth embodiment of the present invention. The method for manufacturing a semiconductor package illustrated in FIG. 12 has substantially the same construction as the method for manufacturing a semiconductor package described above with reference to FIG. 11 except that processes for forming diffusion barriers and seed metal layers are not described. Therefore, detailed descriptions for the same component elements will be omitted herein, and the same terms and the same reference numerals will be used to refer to the same component elements.

Referring now to FIG. 12, after insulation layers 200 and 220, which have openings 210 exposing an internal circuit pattern 50 and a bonding pad 15, are formed on the inner surfaces of blind vias in a semiconductor chip 100, then diffusion barriers 270 and 240 are formed within the insulation layers 200 and 220.

The diffusion barriers 270 and 240 can be formed on the insulation layers 200 and 220 by using any one of an electrografting process, a chemical grafting process and a chemical vapor deposition process.

The diffusion barrier 270 is formed on the insulation layer 200 and has an opening 275 which is aligned with an opening 210 defined in the insulation layer 200. Due to this the diffusion barrier 270 is electrically insulated away from the internal circuit pattern 50.

Thereupon, seed metal layers 280 and 260 are respectively formed within the diffusion barrier 270 and within the diffusion barrier 240. The seed metal layers 280 and 260 can be formed by using any one of a physical and chemical vapor deposition process, an atomic layer deposition process and a chemical vapor deposition process. The seed metal layer 280 is electrically coupled to the internal circuit pattern 50 via the opening 275 defined in the diffusion barrier 270.

After the seed metal layers 280 and 260 are formed, through-electrodes 300 and 310 are formed on the seed metal layers 280 and 260 which completes the manufacture of the semiconductor package 500.

FIGS. 13 through 16 are sectional views illustrating a method for manufacturing a semiconductor package in accordance with a tenth embodiment of the present invention.

Figure 13:
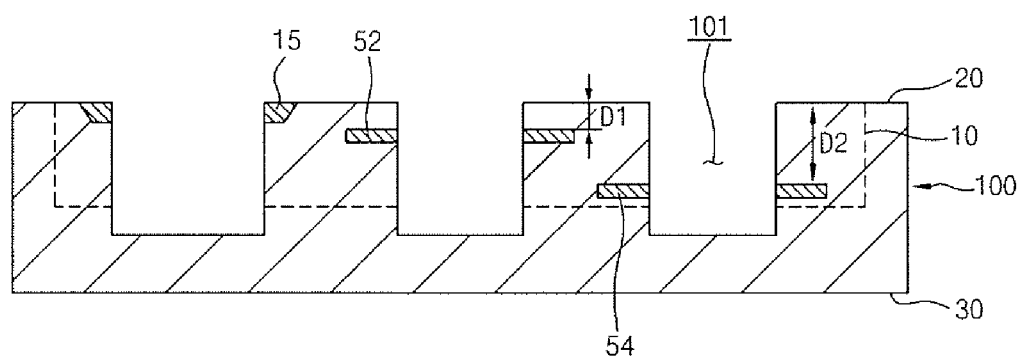
FIGS. 13 through 16 are sectional views illustrating a method for manufacturing a semiconductor package in accordance with a tenth embodiment of the present invention.

Referring to FIG. 13, in order to manufacture a semiconductor package, a semiconductor chip 100 is first manufactured through a semiconductor device manufacturing process.

The semiconductor chip 100 has a first surface 20 and a second surface 30 that faces away from the first surface 20. A circuit section 10, which has a data storage unit (not shown) for storing data and a data processing unit (not shown) for processing data, is formed in the semiconductor chip 100 by using any number of semiconductor device manufacturing processes. A bonding pad 15 is formed on the first surface 20 of the semiconductor chip 100 to be electrically connected with the circuit section 10.

Internal circuit patterns 52 and 54 are formed in the semiconductor chip 100. Hereafter, the internal circuit patterns 52 and 54 which are placed in the semiconductor chip 100 will be defined as a first internal circuit pattern 52 and a second internal circuit pattern 54.

The first internal circuit pattern 52 and the second internal circuit pattern 54 are placed at different positions on the semiconductor chip 100. Also, the first internal circuit pattern 52 and the second internal circuit pattern 54 are formed at different depths with respect to the first surface 20 of the semiconductor chip 100. For example, the first internal circuit pattern 52 is placed at a first depth D1 when measured from the first surface 20, and the second internal circuit pattern 54 is formed at a second depth D2 greater than the first depth D1 when measured from the first surface 20.

In the present embodiment, the first and second internal circuit patterns 52 and 54 can, for example, be formed of different metals. For example, any one of the first and second internal circuit patterns 52 and 54 can be formed of copper and the other of the first and second internal circuit patterns 52 and 54 can be formed of aluminum. Unlike this, the first and second internal circuit patterns 52 and 54 can be formed of the same metal.

After the bonding pad 15 and the first and second internal circuit patterns 52 and 54 are formed in the semiconductor chip 100, blind vias 101 are defined to extend from the first surface 20 toward the second surface 30 of the semiconductor chip 100. The blind vias 101 pass through the bonding pad 15 and the first and second internal circuit pattern 52 and 54 of the semiconductor chip 100. Due to this the first and second internal circuit patterns 52 and 54 are exposed on the inner surfaces of the blind vias 101.

Figure 14:
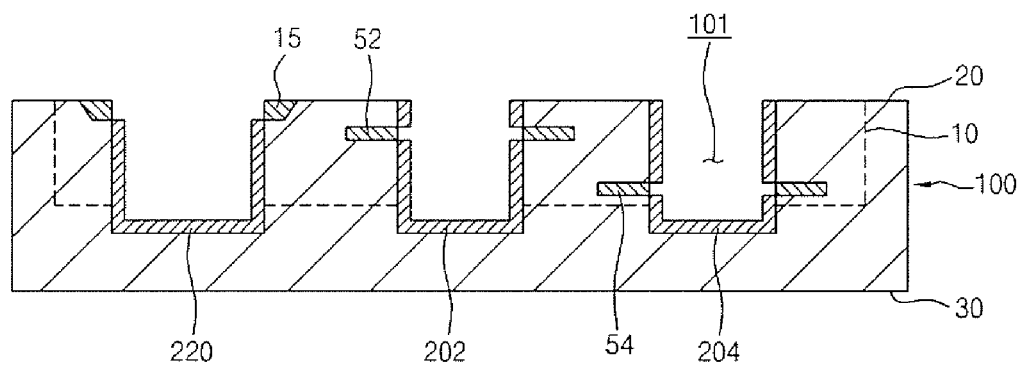

Referring to FIG. 14, a first insulation layer 202, a second insulation layer 204 and a third insulation layer 220 are shown formed on the inner surfaces of the blind vias 101. The first, second, and third insulation layers 202, 204 220 that respectively expose the first and second internal circuit patterns 52 and 54 and the bonding pad 15.

In the present embodiment, the first through third insulation layers 202, 204 and 220 are formed by using any one of an electroless plating process, a sol-gel process, an electrografting process, a chemical grafting process and a chemical vapor deposition process.

Figure 15:
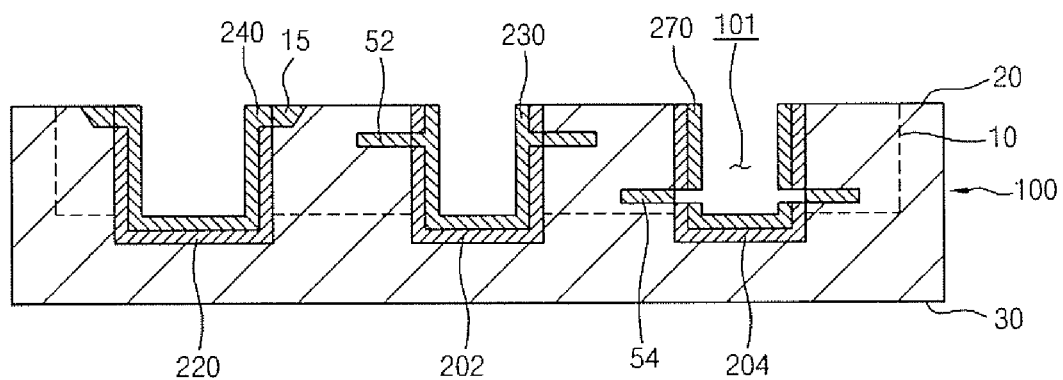

Referring to FIG. 15, a first diffusion barrier 230 is formed on the first insulation layer 202, a second diffusion barrier 270 is formed on the second insulation layer 204, and a third diffusion barrier 240 is formed on the third insulation layer 220. In the present embodiment, the first through third diffusion barriers 230, 270 and 240 are electrically conductive.

In the present embodiment, the first through third diffusion barriers 230, 270 and 240 can be formed by using an electrografting process or a chemical grafting process.

In the present embodiment, the first diffusion barrier 230 is electrically coupled to the first internal circuit pattern 52 via an opening defined in the first insulation layer 202. The second diffusion barrier 270 is placed on the second insulation layer 204. The second diffusion barrier 270 has an opening which exposes the second internal circuit pattern 54, and is therefore electrically insulated away from the second internal circuit pattern 54. The third diffusion barrier 240 is placed on the third insulation layer 220 and is electrically coupled to the bonding pad 15.

Figure 16:
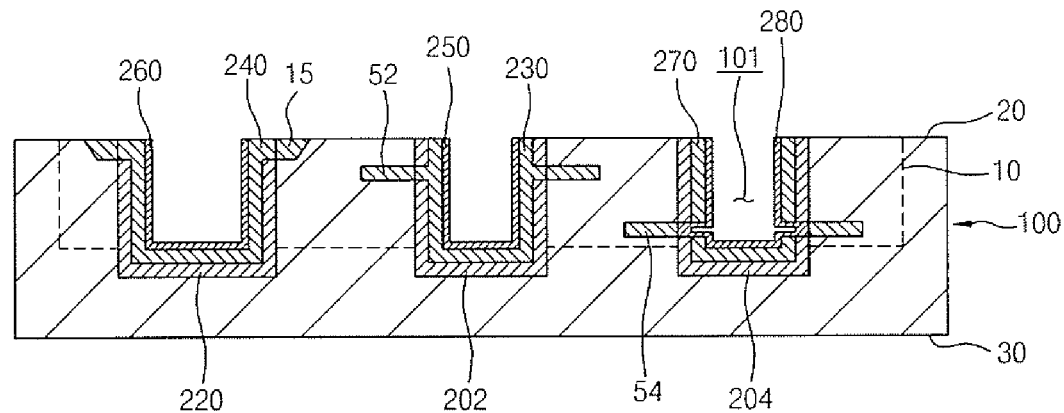

Referring to FIG. 16, after the first through third diffusion barriers 230, 270 and 240 are formed, first through third seed metal layers 250, 280 and 260 are subsequently placed within the respective first through third diffusion barriers 230, 270 and 240. The second seed metal layer 280 formed on the second diffusion barrier 270 is electrically coupled to the second internal circuit pattern 54 through the openings defined in the second diffusion barrier 270 and the second insulation layer 204.

Thereafter, first, second, and third through-electrodes 320, 330 and 310 as shown in FIG. 6 are formed on the respective first, second and third seed metal layers 250, 280 and 260.

As is apparent from the above description, the present invention provides advantages in that bonding pads formed on the upper surface of a semiconductor chip and through-electrodes can be electrically coupled to each other, and internal circuit patterns formed in the semiconductor chip and the through-electrodes can be electrically coupled to each other, whereby it is possible to prevent the volume of a semiconductor chip from increasing due to the use of the through-electrodes.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
    a semiconductor chip comprising:
        a first surface and a second surface which faces away from the first surface,
        a circuit section placed in the semiconductor chip,
        first and second internal circuit patterns electrically coupled to the circuit section and at different depths with respect to the first surface, and
        first and second through-holes in which both pass through the first and second surfaces and respectively pass through the first and second internal circuit patterns;
    first and second insulation layers respectively on the first and second through-holes, the first and second insulation layers respectively having first and second openings that respectively expose the first and second internal circuit patterns along the first and second through-holes;
    first and second through-electrodes respectively within the first and second through-holes and respectively electrically coupled to the first and second internal circuit patterns which are respectively exposed by the first and second internal circuit patterns along the first and second through-holes;
    a first diffusion barrier on the first insulation layer and electrically coupled to the first internal circuit pattern; and
    a second diffusion barrier on the second insulation layer and having an opening that exposes the second internal circuit pattern.

2. The semiconductor package according to claim 1, further comprising:
    a seed metal layer between the first diffusion barrier and the first through-electrode; and
    a second seed metal layer on the second diffusion barrier and electrically coupled to the second internal circuit pattern.

3. The semiconductor package according to claim 1, wherein the first internal circuit pattern and the second internal circuit pattern are formed of different metals.

4. The semiconductor package according to claim 1, further comprising:
    a bonding pad on the first surface of the semiconductor chip and electrically coupled to the circuit section;
    an additional through-electrode electrically coupled to the bonding pad and within an additional through-hole such that the additional through-hole passes through the first and second surfaces; and an additional insulation layer between the additional through-electrode and the additional through-hole.

5. A method for manufacturing a semiconductor package, comprising the steps of:
    manufacturing a semiconductor chip having a first surface and a second surface which faces away from the first surface, a circuit section placed in the semiconductor chip, first and second internal circuit patterns electrically coupled to the circuit section such that the first and second internal circuit patterns are at different depths with respect to the first surface, and first and second through-holes that both pass through the first and second surfaces and the first and second through-holes respectively pass through the first and second internal circuit patterns;
    forming first and second insulation layers respectively on first and second through-holes such that the first and second insulation layer respectfully have first and second openings that expose the first and second internal circuit patterns via the first and second through-holes;
    forming a first diffusion barrier on the first insulation layer to electrically couple the first diffusion barrier to the first internal circuit pattern through the first opening of the first insulation layer and forming a second diffusion barrier on the second insulation layer so that the second diffusion barrier has a third opening which is aligned with the second opening;
    forming a first seed metal layer on the first diffusion barrier and forming a second seed metal layer on the second diffusion barrier such that the second seed metal layer is electrically coupled to the second internal circuit pattern; and
    forming first and second through-electrodes respectively on the first and second seed metal layers.

6. The method according to claim 5, further comprising at least two semiconductor chips stacked together in which through-electrodes of the at least two semiconductor chips are electrically coupled to each other.

7. The method according to claim 5, wherein the first internal circuit pattern and the second internal circuit pattern are formed of different metals.

8. The method according to claim 5, wherein, in the steps of forming the first and second insulation layers and the first and second diffusion barriers, the first and second insulation layers and the first and second diffusion barriers are formed using either an electro-grafting process or a chemical grafting process.

* * * * *